United States Patent
Donofrio et al.

(10) Patent No.: US 9,640,737 B2
(45) Date of Patent: May 2, 2017

(54) HORIZONTAL LIGHT EMITTING DIODES INCLUDING PHOSPHOR PARTICLES

(75) Inventors: Matthew Donofrio, Raleigh, NC (US); John Adam Edmond, Durham, NC (US); James Ibbetson, Santa Barbara, CA (US); David Todd Emerson, Chapel Hill, NC (US); Michael John Bergmann, Chapel Hill, NC (US); Kevin Haberern, Cary, NC (US); Raymond Rosado, Apex, NC (US); Jeffrey Carl Britt, Cary, NC (US)

(73) Assignee: Cree, Inc., Durham, NC (US)

(*) Notice: Subject to any disclaimer, the term of this patent is extended or adjusted under 35 U.S.C. 154(b) by 734 days.

(21) Appl. No.: 13/018,013

(22) Filed: Jan. 31, 2011

(65) Prior Publication Data

US 2012/0193660 A1    Aug. 2, 2012

(51) Int. Cl.
*H01L 33/50*    (2010.01)
*H01L 33/20*    (2010.01)

(52) U.S. Cl.
CPC ............ *H01L 33/505* (2013.01); *H01L 33/20* (2013.01); *H01L 33/507* (2013.01)

(58) Field of Classification Search
CPC ....... H01L 33/20; H01L 33/54; H01L 33/502; H01L 33/50; H01L 2924/12041
USPC ......................... 257/79–81, 98–100
See application file for complete search history.

(56) References Cited

U.S. PATENT DOCUMENTS

| | | | |
|---|---|---|---|
| 4,916,464 A | 4/1990 | Ito et al. | |
| 5,309,001 A | 5/1994 | Watanabe et al. | |
| 5,337,179 A | 8/1994 | Hodges | |
| 5,696,389 A | 12/1997 | Ishikawa et al. | |
| 6,614,056 B1 | 9/2003 | Tarsa et al. | |
| 6,791,119 B2 | 9/2004 | Slater, Jr. et al. | |
| 6,853,010 B2 * | 2/2005 | Slater et al. | 257/98 |
| 6,871,982 B2 | 3/2005 | Holman et al. | |
| 6,964,877 B2 | 11/2005 | Chen et al. | |
| 7,081,667 B2 | 7/2006 | Du | |
| 7,141,825 B2 | 11/2006 | Horio et al. | |
| 7,262,467 B2 | 8/2007 | Kelberlau | |
| 7,285,801 B2 | 10/2007 | Eliashevich et al. | |
| 7,476,337 B2 * | 1/2009 | Sakane et al. | 252/301.4 F |
| 7,652,298 B2 | 1/2010 | Chen et al. | |
| D615,504 S | 5/2010 | Keller et al. | |

(Continued)

FOREIGN PATENT DOCUMENTS

DE    10 2007 029369 A1    1/2009
EP       1 670 073 A1    6/2006

(Continued)

OTHER PUBLICATIONS

Cree, Inc., Data Sheet: "Cree® XLamp® XP-E LEDs", CLD-DS18 Rev. 12, Oct. 27, 2010, 16 pp.

(Continued)

*Primary Examiner* — Ori Nadav
(74) *Attorney, Agent, or Firm* — Myers Bigel, P.A.

(57) ABSTRACT

Horizontal light emitting diodes include anode and cathode contacts on the same face and a transparent substrate having an oblique sidewall. A conformal phosphor layer having an average equivalent particle diameter d50 of at least about 10 μm is provided on the oblique sidewall. High aspect ratio substrates may be provided. The LED may be directly attached to a submount.

28 Claims, 11 Drawing Sheets

(56) References Cited

U.S. PATENT DOCUMENTS

| | | |
|---|---|---|
| 7,737,634 B2 | 6/2010 | Leng et al. |
| 7,800,125 B2 | 9/2010 | Chen |
| 7,852,009 B2 | 12/2010 | Coleman et al. |
| 7,854,365 B2 | 12/2010 | Li et al. |
| 8,008,850 B2 | 8/2011 | Su et al. |
| 8,067,783 B2 | 11/2011 | Wirth |
| 8,115,217 B2 | 2/2012 | Duong et al. |
| 8,492,777 B2 | 7/2013 | Hsieh et al. |
| 8,610,145 B2 | 12/2013 | Yano |
| 2002/0043926 A1 | 4/2002 | Takahashi et al. |
| 2002/0123164 A1 | 9/2002 | Slater, Jr. et al. |
| 2004/0080938 A1 | 4/2004 | Holman et al. |
| 2004/0228115 A1 | 11/2004 | Jacobson et al. |
| 2005/0127485 A1 | 6/2005 | Shei et al. |
| 2005/0179375 A1 | 8/2005 | Kim et al. |
| 2005/0211989 A1 | 9/2005 | Horio et al. |
| 2006/0091415 A1 | 5/2006 | Yan |
| 2006/0113555 A1 | 6/2006 | Yang |
| 2006/0163589 A1 | 7/2006 | Fan et al. |
| 2006/0192223 A1 | 8/2006 | Lee et al. |
| 2006/0208271 A1 | 9/2006 | Kim et al. |
| 2006/0255353 A1 | 11/2006 | Taskar et al. |
| 2006/0262338 A1 | 11/2006 | Momose et al. |
| 2007/0200128 A1 | 8/2007 | Yano |
| 2008/0035947 A1 | 2/2008 | Weaver, Jr. et al. |
| 2008/0315214 A1 | 12/2008 | Wall, Jr. et al. |
| 2009/0050907 A1 | 2/2009 | Yuan et al. |
| 2009/0050908 A1 | 2/2009 | Yuan et al. |
| 2009/0108281 A1 | 4/2009 | Keller et al. |
| 2009/0140633 A1 | 6/2009 | Tanimoto et al. |
| 2009/0145647 A1 | 6/2009 | Tanaka et al. |
| 2009/0161420 A1 | 6/2009 | Shepard |
| 2009/0166653 A1 | 7/2009 | Weaver et al. |
| 2009/0179207 A1 | 7/2009 | Chitnis et al. |
| 2009/0283787 A1 | 11/2009 | Donofrio et al. |
| 2009/0283789 A1 | 11/2009 | Kim et al. |
| 2009/0296384 A1 | 12/2009 | Van De Ven et al. |
| 2009/0315061 A1 | 12/2009 | Andrews |
| 2010/0066229 A1 | 3/2010 | Hamby et al. |
| 2010/0140648 A1 | 6/2010 | Harada et al. |
| 2010/0155763 A1 | 6/2010 | Donofrio et al. |
| 2010/0230693 A1 | 9/2010 | Tran |
| 2010/0308354 A1 | 12/2010 | David et al. |
| 2011/0006334 A1* | 1/2011 | Ishii et al. ................ 257/98 |
| 2011/0018013 A1 | 1/2011 | Margalith et al. |
| 2011/0101389 A1 | 5/2011 | Wu |
| 2011/0114989 A1 | 5/2011 | Suehiro et al. |
| 2012/0146066 A1 | 6/2012 | Tischler et al. |
| 2012/0161161 A1 | 6/2012 | Schubert |

FOREIGN PATENT DOCUMENTS

| | | |
|---|---|---|
| EP | 2 151 873 A2 | 2/2010 |
| JP | 2010-114144 | 5/2010 |

OTHER PUBLICATIONS

Cree, Inc., Data Sheet: "Cree® XLamp® XP-E High-Efficiency White LEDs", CLD-DS34 Rev. 0, Dec. 6, 2010, 11 pp.

Chen K. et al., "Integration of Phosphor Printing and Encapsulant Dispensing Processes for Wafer Level LED Array Packaging", 2010, *11th International Conference on Electronic Packaging Technology & High Density Packaging*, pp. 1386-1392.

International Search Report Corresponding to International Application No. PCT/US12/24580; Date of Mailing: Jun. 22, 2012; 14 Pages.

International Search Report and Written Opinion of the International Searching Authority, International Application No. PCT/US2012/037209, Aug. 6, 2012.

International Search Report and Written Opinion of the International Searching Authority, Application No. PCT/US13/21968, Apr. 5, 2013.

Extended European Search Report corresponding to European Patent Application No. 12742154.3 (7 pages) (dated Sep. 9, 2015).

* cited by examiner

HORIZONTAL LIGHT EMITTING DIODES INCLUDING PHOSPHOR PARTICLES

BACKGROUND

This invention relates to semiconductor light emitting devices and methods of fabricating same, and more particularly to semiconductor Light Emitting Diodes (LEDs) and fabrication methods therefor.

Semiconductor LEDs are widely known solid-state lighting elements that are capable of generating light upon application of voltage thereto. LEDs generally include a diode region having first and second opposing faces, and including therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

LEDs are increasingly being used in lighting/illumination applications, with one ultimate goal being a replacement for the ubiquitous incandescent light bulb.

SUMMARY

Light emitting diodes according to various embodiments described herein comprise a diode region having first and second opposing faces and that include therein an n-type layer and a p-type layer, an anode contact that ohmically contacts the p-type layer and extends on the first face, and a cathode contact that ohmically contacts the n-type layer and that also extends on the first face, to provide a "horizontal" or "lateral" light emitting diode. In some embodiments, the cathode contact and the anode contact collectively occupy at least about 90% of the active area of the diode region. In other embodiments, the anode and cathode contacts that both extend on the first face are coplanar.

A transparent substrate is provided on the second face. The transparent substrate includes an inner face adjacent the second face, an outer face remote from the second face that is of smaller area than the inner face and a sidewall that extends from the outer face to the inner face. In some embodiments, the sidewall is a stepped sidewall. In other embodiments, the sidewall comprises an oblique sidewall that extends at an oblique angle from the outer face towards the inner face.

A conformal layer that comprises phosphor having an average equivalent particle diameter d50 of at least about 10 μm is provided on the outer face and on the sidewall. In other embodiments, an average equivalent diameter d50 of at least about 15 μm is provided. In still other embodiments, an average equivalent diameter d50 of between about 15 μm and about 17 μm is provided.

In some embodiments, the conformal layer that comprises phosphor having an average equivalent particle diameter d50 of at least about 10 μm is of uniform thickness on the outer face and on the oblique sidewall. Moreover, in some embodiments, the diode region is configured to emit blue light upon energization thereof and the conformal layer comprises yellow phosphor having an average equivalent particle diameter d50 of at least about 10 μm. In some of these embodiments, the light emitting diode is configured to produce a maximum variation of Correlated Color Temperature of less than or about 3,000 and, in other embodiments, of less than or about 2,000. In other embodiments, the diode region is configured to emit blue light upon energization thereof and the conformal layer comprises a mixture of yellow phosphor having an average equivalent particle diameter d50 of at least about 10 μm and red phosphor. In some of these embodiments, the light emitting diode is configured to produce a maximum variation of Correlated Color Temperature of less than or about 1,000, in other embodiments, less than or about 500 and, in still other embodiments, less than or about 300. In still other embodiments, the phosphor weight ratio of the yellow phosphor to the red phosphor is at least about 5:1. In yet other embodiments, the phosphor weight ratio of the yellow phosphor to the red phosphor is at least about 9:1.

Light emitting diodes according to various embodiments described herein may be combined with a submount having a submount face and an anode pad and a cathode pad thereon. In these embodiments, the light emitting diode is mounted on the submount such that the first face is adjacent the submount face, the outer face is remote from the submount, the anode contact is adjacent the anode pad and the cathode contact is adjacent the cathode pad. In some embodiments, the anode contact is mounted directly on the anode pad, and the cathode pad is mounted directly on the cathode pad.

Moreover, in other embodiments, the light emitting diode and the submount can be further combined with a lens that extends from the submount face to surround the light emitting diode. In some of these embodiments, the conformal layer that comprises phosphor having an average equivalent particle diameter d50 of at least about 10 μm also extends onto the submount face. Moreover, the submount may include a reflective layer thereon that extends between the submount face and the conformal layer that comprises phosphor that extends on the submount face.

Various geometric configurations of the transparent substrate may also be provided according to various embodiments described herein. In some embodiments, the inner face is a square inner face having sides that are about 1000 μm long, the outer face is a square outer face having sides that are about 642 μm long and a distance between the square inner and outer faces is about 335 μm so as to define an area ratio of the outer face to the inner face of about 0.41. In still other embodiments, the inner face is a square inner face having sides that are about 700 μm long, the outer face is a square outer face having sides that are about 342 μm long and a distance between the square inner and outer faces is about 335 μm so as to define an area ratio between the outer face and the inner face of about 0.24. In yet other embodiments, the inner face is a rectangular inner face of size 350 μm×470 μm. The outer face is a rectangular outer face of size of about 177 μm×297 μm, so as to define an area ratio of top to base of about 0.33, and the distance between the inner and outer faces is about 175 μm. In still other embodiments, the inner face is a rectangular inner face of size of about 350 μm×470 μm. The outer face is a rectangle of about 44 μm×164 μm, so as to define an area ratio between the outer face and the inner face of about 0.04, and the distance between the inner and outer faces is about 290 μm.

In other embodiments, the area ratio of the outer face to the inner face is less than or about 0.4 and, in some of these embodiments, the inner and outer faces define a height therebetween and a ratio of the height to a side of the inner faces at least about 0.3. In other embodiments, the area ratio of the outer face to the inner face is less than or about 0.33 and, in some of these embodiments, the ratio of the height to a side of the inner face is at least about 0.4. In still other embodiments, the area ratio of the outer face to the inner face is less than or about 0.04 and, in some of these embodiments, the ratio of height to a side of the inner face is at least about 0.8.

Moreover, various embodiments of the outer face of the transparent substrate may be provided according to various embodiments described herein. In some embodiments, the outer face is planar. In other embodiments, a groove, such as one or more X-shaped grooves, are included in the outer face.

Various embodiments described herein may provide a packaged light emitting diode. The packaged light emitting diode includes a light emitting diode die, a submount and a lens. The light emitting diode die includes a diode region, an anode contact, a cathode contact and a transparent substrate according to any embodiments that were described above. A conformal layer that comprises phosphor is also provided according to any of the embodiments that were described above. The submount includes a submount face, an anode pad and a cathode pad thereon, according to any of the embodiments that were described above, and the light emitting diode die is mounted on the submount, according to any of the embodiments that were described above. Finally, a lens extends from the submount face to surround the light emitting diode die, according to any of the embodiments described above.

Light emitting diodes according to various other embodiments described herein may include a diode region, an anode contact, a cathode contact and a transparent substrate including an inner face, an outer face of smaller area and a sidewall as was described above. In these embodiments, the area ratio of the outer face to the inner face is less than or about 0.4 and, in some of these embodiments, the inner and outer faces define a height therebetween and a ratio of the height to a side of the inner faces at least about 0.3. In other embodiments, the area ratio of the outer face to the inner face is less than or about 0.33 and, in some of these embodiments, the ratio of the height to a side of the inner face is at least about 0.4. In still other embodiments, the area ratio of the outer face to the inner face is less than or about 0.04 and, in some of these embodiments, the ratio of height to a side of the inner face is at least about 0.8. A conformal layer that comprises phosphor having an average equivalent particle diameter d50 of at least about 10 µm is also provided on the outer face and on the sidewall. Various embodiments of phosphor layers and submounts may be provided as was described above.

Various embodiments described herein may also provide a packaged light emitting diode including a light emitting diode die that comprises a diode region, an anode contact and a cathode contact, as described above. The packaged light emitting diode includes a submount as described above, and a layer that comprises phosphor that is spaced apart from the diode region and that extends conformally onto the submount face away from the light emitting die. A lens may be provided as described above. The phosphor layer may extend on the submount face, and a reflective layer may be provided between the phosphor layer and the submount face, as was described above. Various configurations of phosphor layers may be provided, as was described above, and a lens may be provided, as was described above.

Packaged light emitting diodes according to other embodiments described herein comprise a light emitting diode die that includes a diode region, an n-type layer, a p-type layer, an anode contact, a cathode contact and a transparent substrate including an oblique sidewall as was described above. A conformal layer that comprises phosphor is provided on the outer face and on the oblique sidewall. A submount is provided as was described above, and a lens is provided as was described above. In some embodiments, the light emitting diode die is a square light emitting diode die, so that the inner face of the transparent substrate is a square inner face having sides of less than or about 1,000 µm, and the packaged light emitting diode emits a luminous flux of at least or about 120 lumens of cool white light or at least or about 95 lumens of warm white light, at about 350 mA drive current. In other embodiments, the packaged light emitting diode emits a luminous flux of at least or about 135 lumens of cool white light or at least or about 100 lumens of warm white light, and, in still other embodiments, at least or about 140 lumens of cool white light or at least or about 105 lumens of warm white light, at about 350 mA drive current. In yet other embodiments, the square inner face has sides of less than or about 850 µm, and the packaged light emitting diode emits a luminous flux of at least or about 125 lumens of cool white light or at least or about 90 lumens of warm white light, at about 350 mA drive current. In still other embodiments, the square inner face has sides of less than or about 700 µm, and the packaged light emitting diode emits a luminous flux of at least or about 115 lumens of cool white light or at least or about 90 lumens of warm white light, at about 350 mA drive current.

Packaged light emitting diodes according to other embodiments described herein comprise a light emitting diode die having sides of less than or about 1,000 µm long, and a square submount having sides of less than or about 3.5 mm long. The light emitting diode die is mounted on the submount. A lens extends from the submount to surround the light emitting diode die. The packaged light emitting diode emits at least or about 120 lumens of cool white light or at least or about 95 lumens of warm white light, at about 350 mA drive current. In other embodiments, the packaged light emitting diode emits at least or about 135 lumens of cool white light or at least or about 100 lumens of warm white light, at about 350 mA drive current. In still other embodiments, the packaged light emitting diode emits at least or about 140 lumens of cool white light or at least or about 105 lumens of warm white light, at about 350 mA drive current. In yet other embodiments, the light emitting diode die has sides of less than or about 850 µm long, and the packaged light emitting diode emits at least or about 125 lumens of cool white light or at least or about 90 lumens of warm white light, at about 350 mA drive current. In still other embodiments, the light emitting diode has sides of less than or about 700 µm long and the packaged light emitting diode emits at least or about 115 lumens of cool white light or at least or about 90 lumens of warm white light, at about 350 mA drive current.

DETAILED DESCRIPTION

Figure 1:
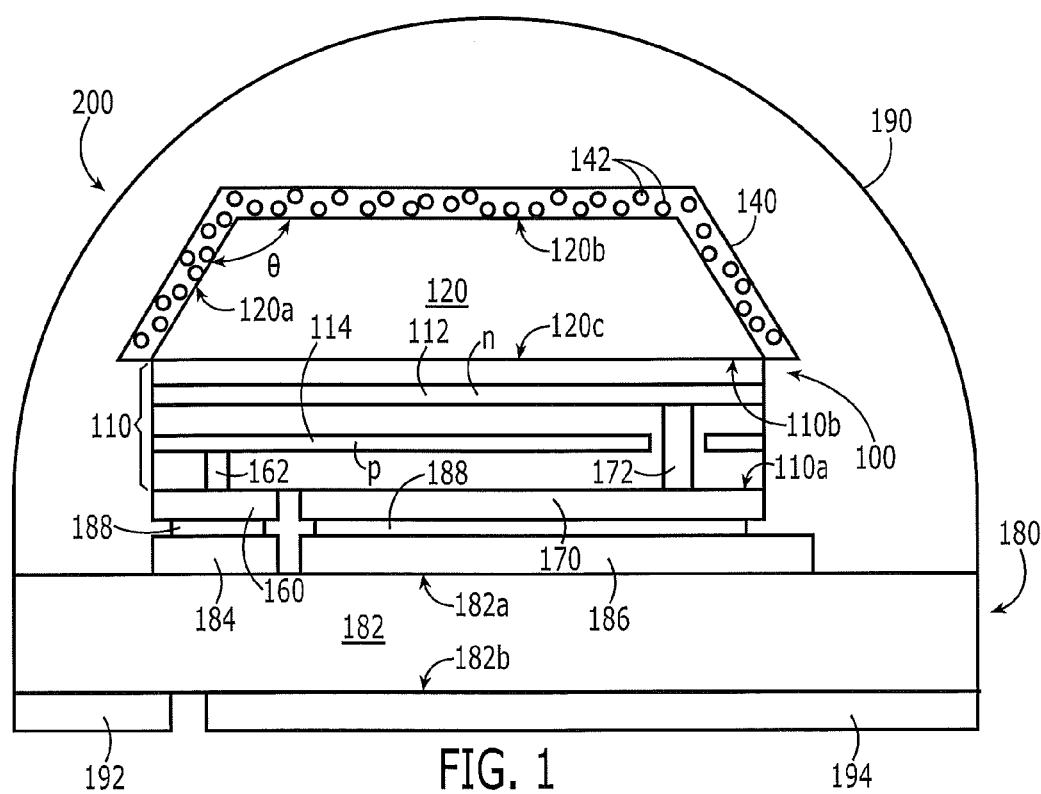
FIGS. 1 and 2 are cross-sections of LEDs and packaged LEDs according to various embodiments described herein.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, a layer or region of an LED is considered to be "transparent" when at least 90% of the radiation from the LED that impinges on the transparent layer or region emerges through the transparent region. For example, in the context of blue and/or green LEDs that are fabricated from gallium nitride-based materials, silicon dioxide can provide a transparent insulating layer (for example, at least 90% transparent), whereas indium tin oxide (ITO) can provide a transparent conductive layer (for example, at least 90% transparent) as measured by considering transmitted and reflected components on a sapphire substrate. Moreover, as used herein, a layer or region of an LED is considered to be "reflective" when at least 90% of the angle averaged radiation that impinges on the reflective layer or region from the LED is reflected back into the LED. For example, in the context of gallium nitride-based blue and/or green LEDs, silver (for example, at least 90% reflective) may be considered reflective materials. In the case of ultraviolet (UV) LEDs, appropriate materials may be selected to provide a desired, and in some embodiments high, reflectivity and/or a desired, and in some embodiments low, absorption.

Some embodiments now will be described generally with reference to gallium nitride (GaN)-based light emitting diodes on silicon carbide (SiC)-based mounting substrates for ease of understanding the description herein. However, it will be understood by those having skill in the art that other embodiments of the present invention may be based on a variety of different combinations of mounting substrate and epitaxial layers. For example, combinations can include AlGaInP diodes on GaP mounting substrates; InGaAs diodes on GaAs mounting substrates; AlGaAs diodes on GaAs mounting substrates; SiC diodes on SiC or sapphire ($Al_2O_3$) mounting substrates and/or a Group III-nitride-based diode on gallium nitride, silicon carbide, aluminum nitride, sapphire, zinc oxide and/or other mounting substrates. Moreover, in other embodiments, a mounting substrate may not be present in the finished product. In some embodiments, the light emitting diodes may be gallium nitride-based LED devices manufactured and sold by Cree, Inc. of Durham, N.C.

It is known to provide a conformal phosphor layer on an oblique or tapered sidewall of a light emitting diode, as described in U.S. Pat. No. 6,853,010, to Slater, Jr. et al., entitled Phosphor-Coated Light Emitting Diodes Including Tapered Sidewalls, and Fabrication Methods Therefor, assigned to the assignee of the present application, the entire disclosure of which is hereby incorporated by reference herein as if set forth fully herein (hereinafter referred to as "the '010 Patent"). As described in the '010 Patent, the tapered or oblique sidewall can allow at least some of the emitting surfaces of a light emitting diode (LED) to be covered with a nearly conformal phosphor-containing layer of substantially uniform thickness. This more conformal coverage can produce a desired spectrum of light, while also allowing more radiant flux to be emitted from the phosphor-coated LED.

Various embodiments described herein may arise from recognition that a conformal phosphor layer on an oblique sidewall of an LED may provide further unanticipated advantages. Specifically, larger particle size phosphor particles may be used in the conformal layer that comprises phosphor. It is well known that larger phosphor particles are generally more efficient in light conversion than small sized phosphor particles. Unfortunately, due to their large size, large phosphor particles may also have a lower light scattering efficiency than relatively small phosphor particles. The low scattering efficiency may produce a high angular variation in Correlated Color Temperature (CCT), which is typical in white LEDs using large particulate size phosphor particles for brightness boost.

In sharp contrast, various embodiments described herein may provide relatively high brightness with relatively low angular variation, by providing a conformal layer that comprises large phosphor particles on the outer face and on the oblique sidewall of an LED.

It will be understood that real world phosphor particle layers are not precisely uniform in size. Rather, consistent with other particulate materials, a range of particle sizes may be provided, and various metrics are used to indicate a measure of particle size in a particulate material. Particle size is generally measured by an equivalent particle diameter, which may take into account the fact that the particles may be non-spherical. Moreover, the particle size distribution may be specified by providing one or more equivalent particle diameters, often abbreviated with "d", to indicate a mass percent of the particles that has a smaller diameter. Thus, d50, also referred to as an average equivalent particle diameter, indicates that 50 mass-% of the particles has a smaller diameter. Moreover, an equivalent particle diameter d10 refers to 10 mass-% of the particles having a smaller diameter, whereas an equivalent particle diameter d90 refers to 90 mass-% of the particles having a smaller diameter. A given phosphor may be specified in terms of d50, d10 and/or d90. Moreover, other metrics other than d50, d10 and d90 may be used, such as d75 and d25. Combinations of these metrics also may be used.

FIG. 1 is a cross-sectional view of a light emitting diode (also referred to as a light emitting diode "die" or "chip") and a packaged light emitting diode according to various embodiments described herein. Referring to FIG. 1, these light emitting diodes 100 include a diode region 110 having first and second opposing faces 110a, 110b, respectively, and including therein an n-type layer 112 and a p-type layer 114. Other layers or regions may be provided, which may include quantum wells, buffer layers, etc., that need not be described herein. An anode contact 160 ohmically contacts the p-type layer 114 and extends on a first face 110a. The anode contact 160 may directly ohmically contact the p-type layer 114, or may ohmically contact the p-type layer 114 by way of one or more conductive vias 162 and/or other intermediate layers. A cathode contact 170 ohmically contacts the n-type layer 112 and also extends on the first face 110a. The cathode contact may directly ohmically contact the n-type layer 112, or may ohmically contact the n-type layer 112 by way of one or more conductive vias 172 and/or other intermediate layers. As illustrated in FIG. 1, the anode contact 160 and that cathode contact 170 that both extend on the first face 110a are coplanar. The diode region 110 also may be referred to herein as an "LED epi region", because it is typically formed epitaxially on a substrate 120. For example, a Group III-nitride based LED epi 110 may be formed on a silicon carbide growth substrate. In some embodiments, as will be described below, the growth substrate may be present in the finished product. In other embodiments, the growth substrate may be removed. In still other embodiments, another substrate may be provided that is different from the growth substrate.

As also shown in FIG. 1, a transparent substrate 120, such as a transparent silicon carbide growth substrate, is included on the second face 110b of the diode region 110. The transparent substrate 120 includes a sidewall 120a and may also include an inner face 120c adjacent the second face 110b of the diode region 110 and an outer face 120b, remote from the inner face 120c. The outer face 120b is of smaller area than the inner face 120c. In some embodiments, the sidewall 120a may be stepped, beveled and/or faceted, so as to provide the outer face 120b that is of smaller area than the inner face 120c. In other embodiments, as shown in FIG. 1, the sidewall is an oblique sidewall 120a that extends at an oblique angle θ, and in some embodiments at an obtuse angle, from the outer face 120b towards the inner face 120c.

LEDs 100 configured as was described above in connection with FIG. 1; may be referred to as "horizontal" or "lateral" LEDs, because both the anode and the cathode contacts thereof are provided on a single face of the LED. Horizontal LEDs may be contrasted with vertical LEDs in which the anode and cathode contacts are provided on opposite faces thereof, as is illustrated, for example, in the '010 Patent.

Various other configurations of horizontal LEDs that may be used according to any of the embodiments described herein, are described in detail in U.S. Patent Application publication 2009/0283787 to Donofrio et al., entitled Semiconductor Light Emitting Diodes Having Reflective Structures and Methods of Fabricating Same, assigned to the assignee of the present application, the disclosure of which is hereby incorporated herein by reference in its entirety as if set forth fully herein (hereinafter referred to as "the '787 Publication").

Still continuing with the description of FIG. 1, a conformal layer 140 that comprises phosphor particles 142 having an average equivalent particle diameter d50 of at least 10 µm, is provided on the outer face 120b and on the oblique sidewall 120a. In embodiments of FIG. 1, the entire outer face 120b and the entire oblique sidewall 120a are covered with the phosphor layer 140. However, in other embodiments, the entire outer face 120b and/or the entire oblique sidewall 120a need not be covered with the phosphor layer 140. Moreover, the conformal phosphor layer 140 may be of uniform thickness on the outer face 120b and on the oblique sidewall 120a. In some embodiments, this uniform thickness is between the range of between about 36 µm and about 56 µm and, in other embodiments, a range of between about 30

μm and about 75 μm may be provided. In other embodiments, a thickness of about 46 μm may be provided.

Various embodiments of phosphor layers 140 and diode regions 110 may be provided according to various embodiments described herein. For example, in some embodiments, the diode region 110 is configured to emit blue light, for example light having a dominant wavelength of about 450-460 nm, and the conformal layer comprises yellow phosphor, such as YAG:Ce phosphor having a peak wavelength of about 550 nm and an average equivalent particle diameter d50 of at least 10 μm. In other embodiments, an average equivalent diameter d50 of at about 15 μm is provided. In still other embodiments, an average equivalent diameter d50 of between about 15 μm and about 17 μm is provided.

In other embodiments, the diode region 110 is configured to emit blue light upon energization thereof, as described above, and the conformal layer 140 may comprise a mixture of phosphor having average equivalent particle diameter of at least about 10 μm, as described above, and red phosphor, such as a CASN-based phosphor, having an average equivalent particle diameter d50 of about 10 μm in size. In still other embodiments, the mixture of yellow phosphor and red phosphor may have a phosphor weight ratio of the yellow phosphor to the red phosphor of at least about 5:1 and, in other embodiments, at least about 9:1. In some embodiments, since at least five times as much yellow phosphor as red phosphor is provided, a wider range of red phosphor particle sizes may be used in combination with yellow phosphor particles having an average equivalent particle diameter d50 of at least about 10 μm.

As was described above, various embodiments of FIG. 1 may arise from recognition that a conformal phosphor layer 140 on an oblique sidewall 120a of an LED 100 may provide further unanticipated advantages. Specifically, large particle size phosphor particles 142 may be used in the conformal layer 140 that comprises phosphor. It is well known that larger phosphor particles 142 are generally more efficient in light conversion than small sized phosphor particles. Unfortunately, due to their large size, large phosphor particles 142 may also have a lower light scattering efficiency than relatively small phosphor particles. The low scattering efficiency may produce a high angular variation in CCT, which is typical in white LEDs using large particulate size phosphor particles for brightness boost.

In sharp contrast, various embodiments described herein may provide relatively high brightness with relatively low angular variation, by providing a conformal layer 140 that comprises large phosphor particles 142 on the outer face 120b and on the oblique sidewall 120a of an LED.

Moreover, various embodiments described herein may provide other unexpected advantages. Specifically, since the CCT variation can be reduced compared to an LED with a non-oblique sidewall, less red phosphor may need to be used. For example, with non-oblique walls, a ratio of yellow phosphor to red phosphor may be about 2:1 whereas, as described above, ratios of at least about 5:1 or at least about 9:1 may be used. Since red phosphor often is more expensive than yellow phosphor, lower cost LEDs may be obtained. Moreover, since a higher ratio of yellow phosphor to red phosphor may be used, the particle size of the red phosphor may vary over a wide range because the particle size of the yellow phosphor will dominate.

Continuing with the description of FIG. 1, the LED 100 may be combined with a mounting substrate or submount 180 and a lens 190 to provide a packaged LED 200. The submount 180 may include a body 182 that may comprise aluminum nitride (AlN). In other embodiments, metal core substrates, printed circuit boards, lead frames and/or other conventional mounting substrates may be used to mount the LED 100 in a flip-chip configuration. The submount 180 includes a submount face 182a, and an anode pad 184 and a cathode pad 186 thereon. The anode and cathode pads may comprise silver-plated copper and/or other conductive materials. As illustrated in FIG. 1, the LED 100 is mounted on the submount 180, such that the first face 110a is adjacent the submount face 182a, the outer face 110b is remote from the submount 180, the anode contact 184 is adjacent the anode pad 160, and the cathode contact 186 is adjacent the cathode pad 170. In some embodiments, a bonding layer, such as a eutectic gold/tin solder layer 188, is used to electrically, thermally and mechanically connect the anode contact 160 to the anode pad 184, and the cathode contact 170 to the cathode pad 186. In other embodiments, direct attachment of the anode contact 160 to the anode pad 184, and direct attachment of the cathode contact 170 to the cathode pad 186 may be provided, for example using thermocompression bonding and/or other techniques.

A packaged device anode 192 and a packaged device cathode 194 may be provided on a second face 182b of the submount body 182, and may be connected to the anode pad 184 and cathode pad 186, respectively, using internal vias and/or conductive layers that extend on and/or around the submount body 182.

Various embodiments of submounts 180 that may be used with embodiments described herein, are described in the '787 Publication that was cited above. Various other embodiments of submounts 180 are described in U.S. Patent Application Publication 2009/0108281 to Keller et al., entitled Light Emitting Diode Package and Method for Fabricating Same, assigned to the assignee of the present application, the disclosure of which is hereby incorporated herein by reference in its entirety as if set forth fully herein (hereinafter referred to as "the '281 Publication"). It will be understood that any and all embodiments of these submounts may be used in embodiments of FIG. 1. However, the pad structure on the submount may be modified so as to be used with a horizontal LED 100 of FIG. 1, rather than the vertical LEDs described in the '281 Publication.

Finally, the packaged LED 200 may also include a lens 190 that extends from submount face 180a to surround the LED 100. The lens 190 may be a molded plastic lens, as described in detail in the '281 Publication, and may be fabricated on the submount according to techniques that are described in the '281 Publication, and/or other techniques. In some embodiments, the lens may be about 3.06 mm in diameter.

Figure 2:
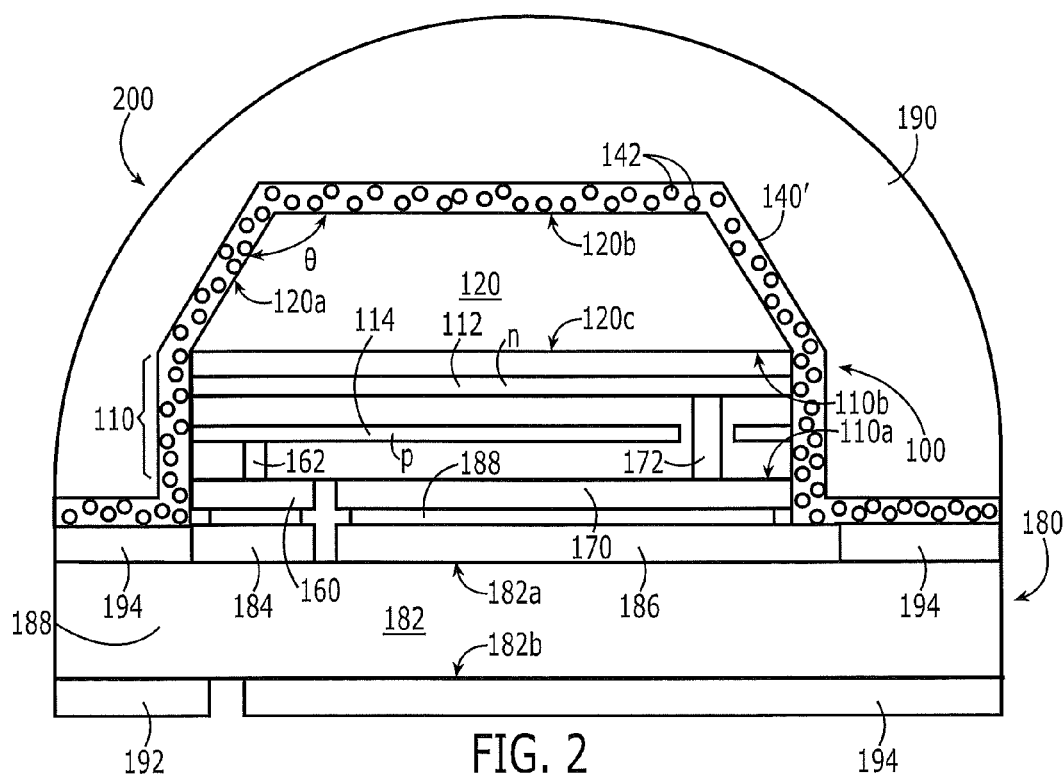

FIG. 2 is a cross-sectional view of LEDs and packaged LEDs according to various other embodiments. Compared to embodiments of FIG. 1, the phosphor layer 140' extends across the diode region 110 and/or on the first face 182 of the submount body 182. The phosphor layer may be fabricated to extend onto the submount as is described in the '281 Publication. Moreover, as shown in FIG. 2, the submount 180 may include a layer 194 on the first face 182a thereof. The layer 194 may be an extension of the anode pad 184 and the cathode pad 186 or may be distinct therefrom. In some embodiments, the layer 194 is a reflective layer that extends between the submount face 182a and the conformal layer 140' that includes phosphor that extends on the submount face 182a. This reflective layer 194 can reflect light that passes through the phosphor layer that is on the submount face 182a back toward the lens 190, and can thereby increase efficiency of the LED.

Packaged LEDs as described above in connection with FIGS. 1 and 2 may be embodied as a Cree® XLamp® XP-E High-Efficiency White (HEW) LED, as described, for example, in the Cree® XLamp® XP-E High-Efficiency White LEDs Data Sheet, Publication No. CLD-DS34, Rev. 0, dated Dec. 6, 2010, and available at cree.com/products/xlamp_xpe.asp, the disclosure of which is hereby incorporated herein by reference in its entirety as if set forth fully herein.

Figure 3C:
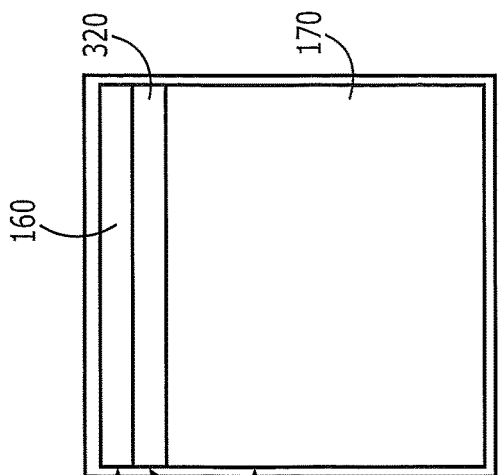
FIGS. 3A, 3B and 3C are a top view, a cross-section and a bottom view, respectively, of an LED according to embodiments of FIG. 1 or 2.
Figure 3B:
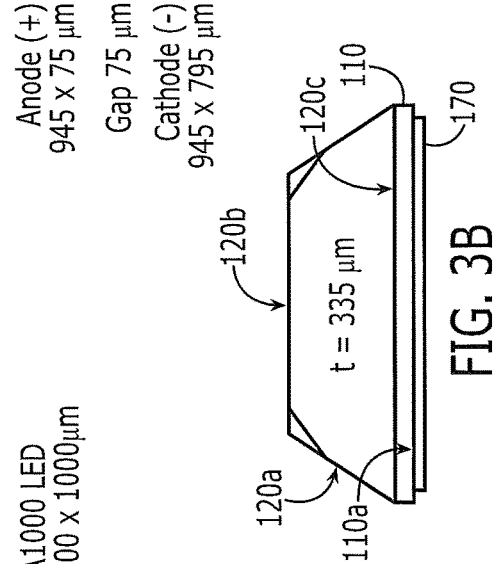
Figure 3A:
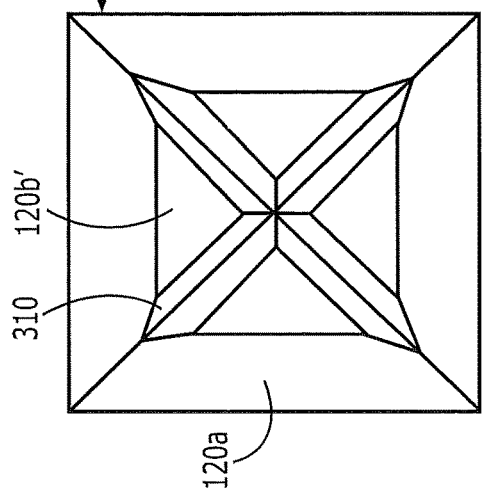

FIGS. 3A, 3B and 3C are a top view, a cross-section and a bottom view, respectively, of an LED 100 of FIG. 1 or 2. The phosphor layer 140/140' is not illustrated.

In FIGS. 1 and 2, the outer face 120b was planar. However, in embodiments of FIG. 3A, the outer face 120b' includes at least one groove, such as an X-shaped groove 310 therein. Multiple X-shaped grooves and/or other shaped grooves may also be provided. Moreover, as shown in FIG. 3C, in some embodiments, the anode contact 160 and the cathode contact 170 may collectively occupy at least about 90% of the active diode region area.

Specifically, FIGS. 3A-3C illustrate an embodiment wherein the inner face 120c of the substrate 120 is a square inner face 120c having sides that are about 1,000 μm long, the outer face 120b' is a square outer face having sides that are about 642 μm long, and a thickness or distance t between the square inner and outer faces (also referred to as "height") is about 335 μm, so as to define an area ratio between the outer face 120b and the inner face 120c of about 0.41. The diode region 110 may also be a square, having sides that are about 1,000 μm long. A small gap 320 of about 75 μm is provided. A calculation of the active attach area may be made as follows:

Total active area of diode region=751,275 μm² (cathode)+70,875 μm²(gap)+70,875 μm² (anode)=893,025 μm².

Total active attach area=751,275 μm²(cathode)+70,875 μm²(anode)=822,150 μm².

Thus, the active attach area is at least about 90% of the active diode region area.

Table 1 illustrates various configuration geometries of the substrate 120 that may be provided according to various other embodiments. It will be understood that the "area ratios" used herein are based on the dimensions of the sides of the faces and do not include any added surface area due to texturing, grooves and/or other light extraction features.

TABLE 1

| Designator | Base (Inner) Area, μm² | Top (Outer) Area, μm² | Area Ratio (Top/Base) | Aspect Ratio (Height/Base) |
|---|---|---|---|---|
| DA1000 | 1000000 | 412164 | 0.412164 | 0.335 |
| DA850 | 722500 | 242064 | 0.335036678 | 0.394 |
| DA700 | 490000 | 116964 | 0.238702041 | 0.5 |

Figure 4:
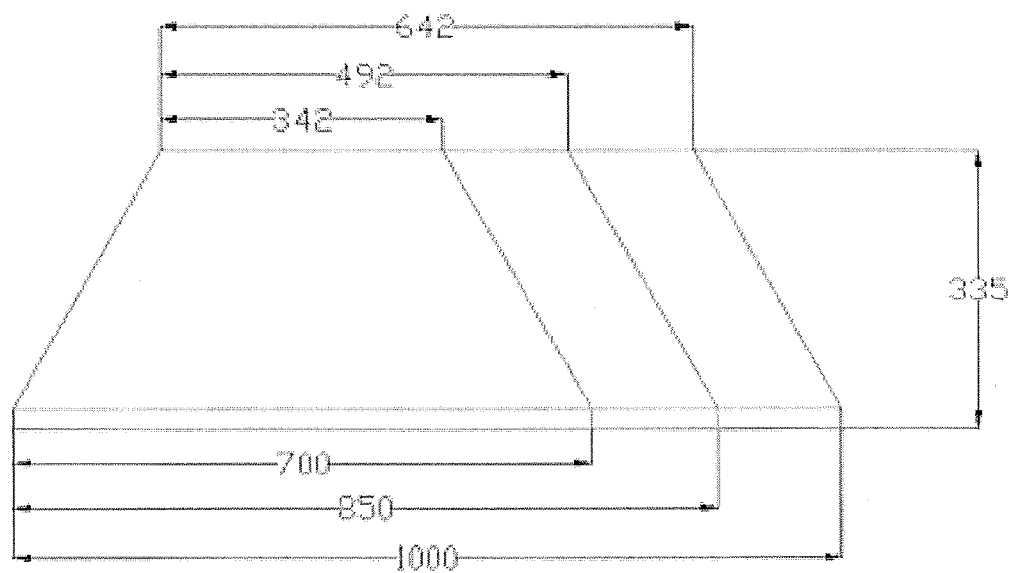
FIGS. 4 and 5 illustrate various geometries of substrates of FIGS. 1-3, according to various embodiments described herein.

FIG. 4 illustrates these embodiments. Specifically, the top row of Table 1 illustrates various embodiments wherein the inner face 120c is a square inner face having sides that are about 1000 μm long (total area 1000000 μm²), the outer face 120b is a square outer face having sides that are about 642 μm long (total area 412164 μm²) and a distance (height) between the square inner and outer faces is about 335 μm so as to define an area ratio of the outer face to the inner face (top to base) of about 0.41, and aspect ratio of height to a side of the inner face (base) of about 0.335. These embodiments are also illustrated in FIG. 3B. The second row of Table 1 illustrates embodiments wherein the inner face 120c is a square inner face having sides that are about 850 μm long (total area 722500 μm²), the outer face 120b is a square outer face having sides that are about 492 μm long (total area 242064 μm²) and a distance (height) between the square inner and outer faces is about 335 μm so as to define an area ratio of the outer face to the inner face of about 0.33 and an aspect ratio of height to base of about 0.39. Finally, the third row of Table 1 illustrates various embodiments wherein the inner face 120c is a square inner face having sides that are about 700 μm long (total area about 722500 μm²), the outer face 120b is a square outer face having sides that are about 342 μm long (total area about 116964 μm²) and a distance height between the square inner and outer faces is about 335 μm so as to define an area ratio of the outer face to the inner face of about 0.24 and an aspect ratio of height to base of about 0.5.

Figure 5:
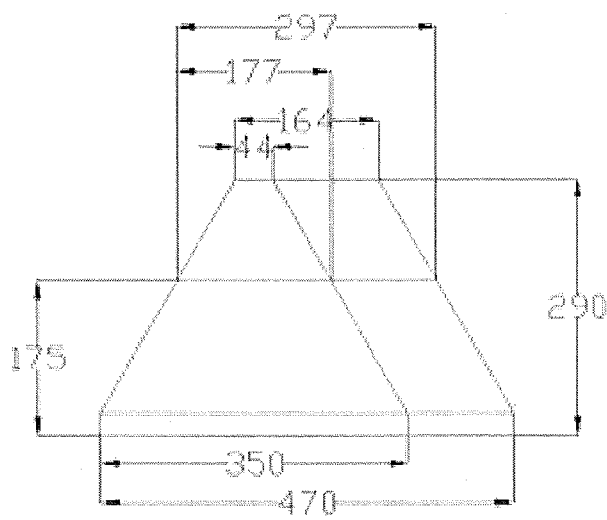

FIG. 5 and Table 2 illustrate other embodiments wherein the inner face 120c is a rectangular inner face of size 350 μm×470 μm. In the first line of Table 2, the height is about 175 μm thick, and the outer face 120b is a rectangle of size 177 μm×297 μm, so as to provide a base (inner) area of 164500 μm² and a top (outer) area of 52569 μm. The area ratio of top to base is about 0.32, and the ratio of height to base is about 0.5. The second line of Table 2 illustrates a thicker height of about 290 μm, so that the top has sides of about 44 μm×164 μm, leading to an area ratio of about 0.044 and a ratio of height to base of about 0.8.

TABLE 2

| Designator | Base (Inner) Area, μm² | Top (Outer) Area, μm² | Area Ratio (Top/Base) | Aspect Ratio (Height/Base) |
|---|---|---|---|---|
| DA350 - Standard 175 μm thick | 164500 | 52569 | 0.319568389 | 0.5 |
| DA350 Extreme - 290 μm thick | 164500 | 7216 | 0.043866261 | 0.828 |

Accordingly, embodiments of Table 1 and Table 2, corresponding to FIGS. 4 and 5, can provide light emitting diodes wherein an area ratio of the outer face to the inner face is less than or about 0.4 and, in some of these embodiments, the aspect ratio of the height to a side of the inner face is at least about 0.3. These tables and figures also illustrate other embodiments wherein the area ratio of the outer face to the inner face is less than or about 0.33 and, in some embodiments, the aspect ratio of the height to a side of the inner face is at least about 0.4. These tables and figures also illustrate yet other embodiments wherein the area ratio of the outer face to the inner face is less than or about 0.04 and, in some embodiments, the height to base aspect ratio is at least about 0.8.

It has been found that light extraction may be improved as the ratio of the outer area to the inner area is reduced. The larger area devices, such as the DA1000 described on the first line of Table 1 can provide additional extraction by providing a groove, as was illustrated in FIG. 3A. This would appear to indicate that further extraction benefit would be obtained by a further reduction in the ratio of the top to base, but this may be expensive due to the blade width that may be needed for beveling the sidewalls. On the smaller devices, such as the DA350 described in the first row of Table 2, there may be no further gain at blue light in further increasing the ratio, so that an aspect ratio of about 0.32 may already be sufficient for maximum blue extraction.

Lateral LED configurations as were described in Tables 1 and 2 can allow for very low ratios of top to base (outer to inner surfaces of the substrate) compared to previous generation vertical chips, since the backside (top) contact area need not be considered for the electrical performance of the device. Moreover, improved light extraction of these devices may also be a factor in conversion efficiency, since the phosphor layers can scatter light back into the chips.

Figure 6A:
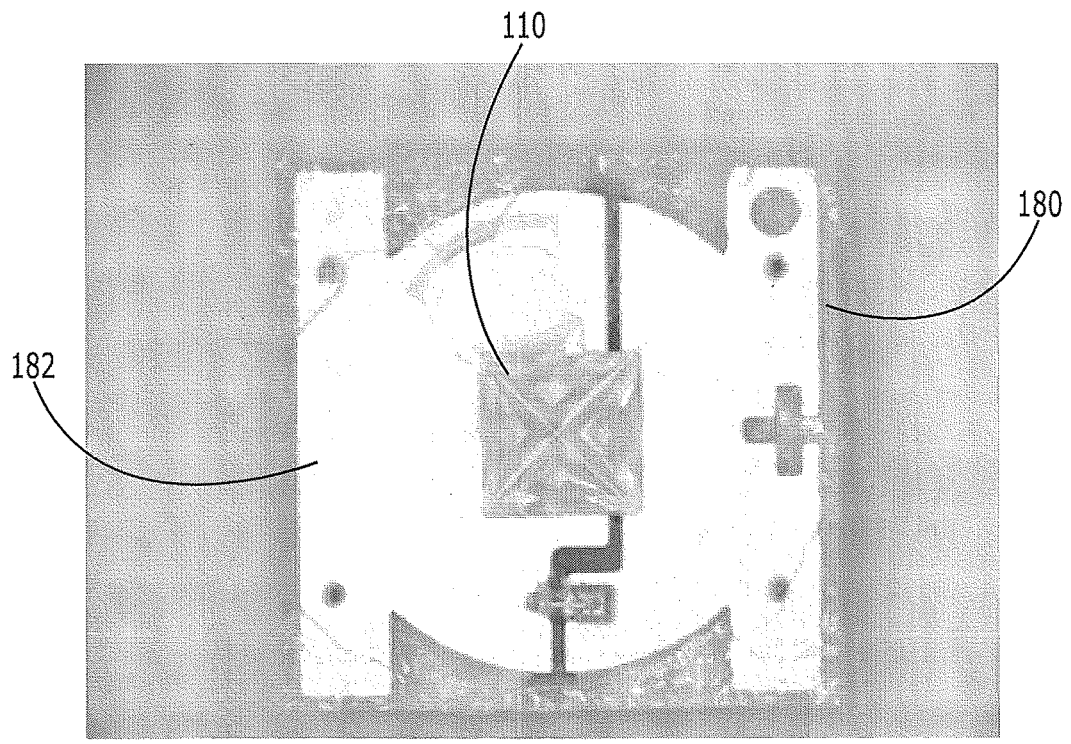
FIG. 6A is a photograph of a submount with an LED mounted thereon according to various embodiments of FIGS. 1-4.
Figure 6B:
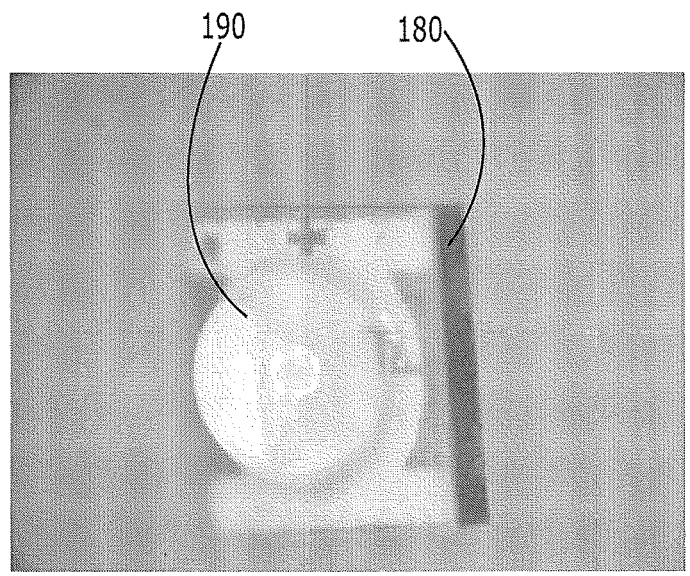
FIG. 6B is a photograph of a packaged LED according to various embodiments of FIGS. 1-4.

FIG. 6A is a photograph of a submount 180 with an LED 110 mounted thereon, as was described in connection with FIGS. 1-4. FIG. 6B is a photograph of a packaged LED 200 of FIGS. 1-4 including lens 190.

Various embodiments that were illustrated in FIGS. 1-6 may also be regarded as illustrating a light emitting diode 100 that comprises a diode region 110 having first and second opposing faces 110a, 110b and including therein an n-type layer 112 and a p-type layer 114. An anode contact 160 ohmically contacts the p-type layer and extends on the first face 110a. A cathode contact 170 ohmically contacts the n-type layer 112 and also extends on the first face 110a. A transparent substrate 120 is provided on the second face 110b. The transparent substrate includes an inner face 120c adjacent the second face 110b, an outer face 120b remote from the second face that is of smaller area than the inner face 120c, and a sidewall 120a that extends from the outer face to the inner face. An area ratio of the outer face to the inner face is less than or about 0.4. In some embodiments, the sidewall is a stepped sidewall. In other embodiments, the sidewall comprises an oblique sidewall that extends at an oblique angle from the outer face towards the inner face. A conformal layer 140, 140' that comprises phosphor 142 having an average equivalent particle diameter d50 of at least about 10 µm is provided on the outer face 120b and on the sidewall 120a.

FIGS. 1-6 may also be regarded as describing other embodiments of a packaged light emitting diode die 200 that includes a light emitting diode die including a diode region, an anode contact and a cathode contact, as described above. A submount 180 is also provided as was described above. Moreover, a conformal layer 140, 140' that comprises phosphor 142 is spaced apart from the diode region 110 and extends conformally onto the submount face 182a away from the light emitting diode die 110. The conformal layer may be spaced apart from the diode region by the transparent substrate 120 and/or by other means, such as a dome.

COMPARATIVE EXAMPLES

The following Comparative Examples shall be regarded as merely illustrative and shall not be construed as limiting the invention. The following Examples will describe comparative measurements between a Cree® XLamp® XP-E LED, as described, for example, in the *Cree® XLamp® XP-E LEDs Data Sheet*, Publication No. CLD-DS18, Rev. 12, dated Oct. 27, 2010, and available at cree.com/products/xlamp_xpe.asp, the disclosure of which is hereby incorporated herein by reference in its entirety as if set forth fully herein, which will be referred to hereinafter as an "XP-E LED". These XP-E LEDs will be compared to a Cree® XLamp® XP-E High-Efficiency White (HEW) LED, as described in the above cited *Cree® XLamp® XP-E High Efficiency White LEDs Data Sheet*, Publication No. CLD-DS34, Rev. 0, Dec. 6, 2010, which will be referred to hereinafter as an "XP-E HEW LED". The XP-E LEDs are vertical LEDs that may include a thinned substrate. The substrate does not have an oblique sidewall, although the diode region may have an oblique sidewall as defined by the crystal planes of the diode region as described, for example, in U.S. Pat. No. 7,791,061, assigned to the assignee of the present application, the disclosure of which is hereby incorporated by reference herein in its entirety as if set forth fully herein. These XP-E LEDs have a backside to frontside area ratio of about 0.99, since the LED epi film is only about 4 µm thick. The outer face is roughened and a phosphor layer is provided on the roughened outer face and on the non-beveled sidewall of the substrate. The XP-E HEW LEDs may be embodied according to FIGS. 1-6 herein.

Particle Size:

XP-E LEDs may include YAG:Ce yellow phosphor with d50 of about 5.5 µm. In contrast, XP-E HEW LEDs according to embodiments described herein, may include a d50 particle size of YAG:Ce phosphor of about 15 µm in some embodiments, between about 15 µm and about 17 µm in other embodiments, between about 10 µm and 20 µm in still other embodiments and at least about 10 µm in yet other embodiments. Thus, a particle size that is at least about twice the average yellow phosphor particle size of the XP-E LEDs may be provided. In any of these embodiments, when red phosphor, such as CASN, is added to provide warm in white characteristics, an average red phosphor particle size of about 10 µm, and in some embodiments between 7 µm and about 12 µm, may be provided. In general, because less red phosphor is used than yellow phosphor, the average particle size need not be made as large, and can even be small in size in some embodiments.

Figure 10:
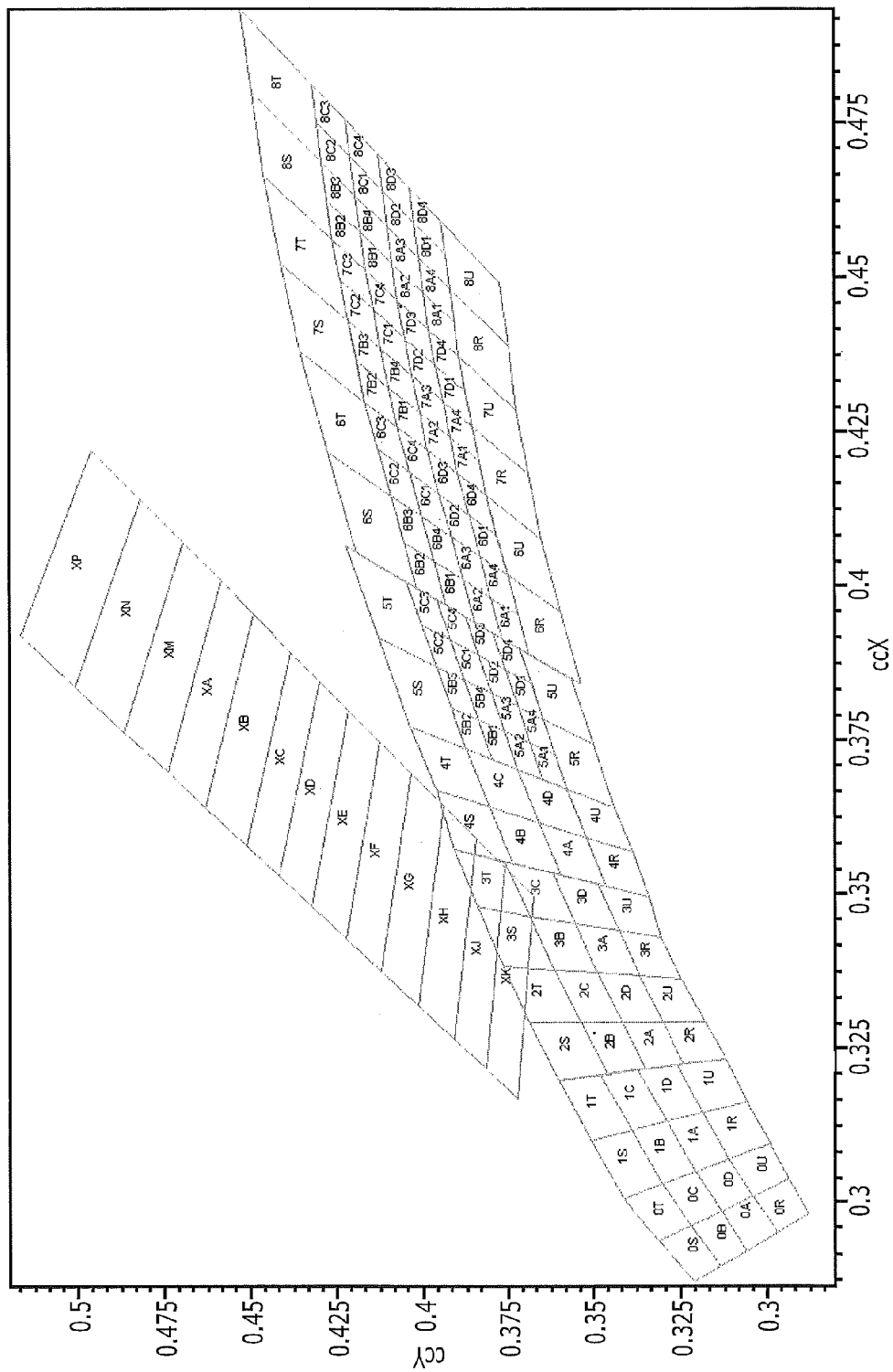
FIG. 10 graphically illustrates an ANSI bin chart.

Phosphor Ratios:

Phosphor ratios may be measured by weight % ratios of yellow to red phosphor. An XP-E LED conventionally has a yellow:red ratio of about 2:1 for warm white targeting of the ANSI ww color bins in the 7C/7D/8A/8B bins of the ANSI bin chart of FIG. 10. In sharp contrast, XP-E HEW LEDs may have a phosphor weight ratio of at least about 5:1 and, in some embodiments, these ratios may be about 6.5:1 and even about 9:1 for the same color space. It will be understood that these ratios may vary dependent on the targeted CIE color space, efficiency of the phosphor used and/or the dominant wavelength of the blue LED that is used.

Moreover, various embodiments described herein can also provide reduced flux density in the phosphor layer, as compared to XP-E LEDs, due to the increased surface area resulting from the beveled sidewalls, low outer face to inner face ratios and/or additional features, such as X-shaped grooves that can significantly increase the surface area that is coated. This increased surface area may reduce the thermal and flux density impact on phosphor conversion efficiency. Finally, when the substrate is fabricated from silicon carbide, the high thermal conductivity of the substrate can also aid in heat dissipation from the phosphor layer, which can also increase long-term performance and reliability.

Phosphor Layer Thickness:

The thickness of the phosphor layer may be about the same as between the XP-E LEDs and the XP-E HEW LEDs. In some cool white embodiments, the total phosphor thickness may be about 46 µm, with a range of between about 36 µm to about 56 µm in some embodiments, and a range of about 30 µm to about 75 µm in other embodiments. For warm white embodiments, the total phosphor layer thickness may be about 90 µm, with a range of between about 80 µm and about 100 µm in some embodiments, and a range of between 65 µm and about 120 µm in other embodiments. It will be understood that the method of coating the phosphor and/or the profile of the LED and/or submount that is being coated may produce variations in conformal phosphor layer thickness, as described, for example, in U.S. Patent Application Publication 2010/0155763 to Donofrio et al., entitled Systems and Methods for Application of Optical Materials to Optical Elements, assigned to the assignee of the present application, the entire disclosure of which is hereby incorporated by reference herein as if set forth fully herein (hereinafter referred to as "the '763 Publication").

It will also be understood that the phosphor layer thickness may be dependent upon the phosphor loading % relative to the silicone or other binder, phosphor efficiency and/or wavelength of the blue LED. The above thicknesses assume a loading % of about 64% by total weight, i.e., about 1.75 g phosphor/1 gr silicone=63.6%. This loading % is also described in detail in the '763 Publication.

Figure 7:
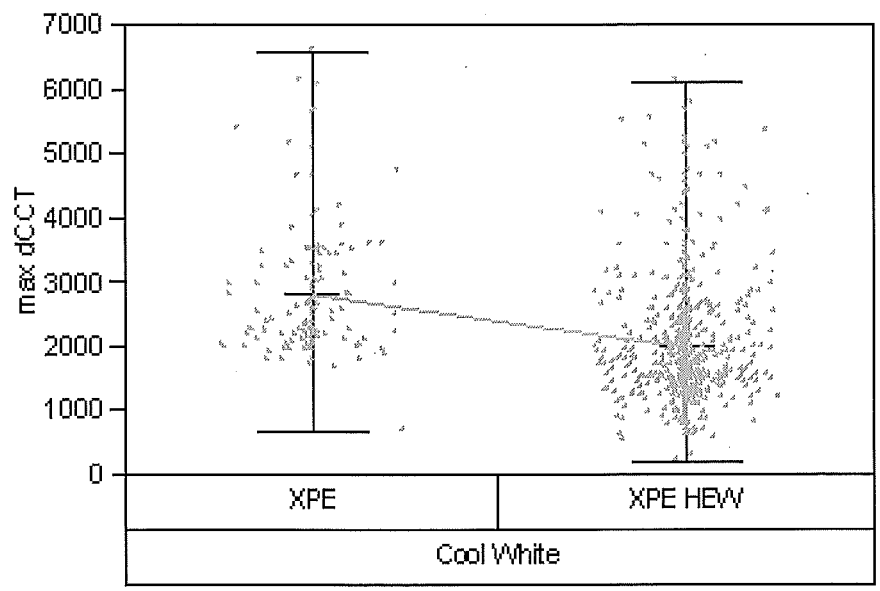
FIG. 7 graphically illustrates a comparison of maximum change in Correlated Color Temperature (CCT) for various cool white LEDs.

FIG. 7 graphically illustrates the variability of maximum change in CCT (max delta CCT or max dCCT) for an XP-E LED and an XP-E HEW LED, wherein the XP-E LED uses a YAG:Ce d50 of about 5.5 μm and the XP-E HEW LED uses a YAG:Ce d50 of about 15 μm. Unexpectedly, very little difference in max dCCT is shown, even though the d50 of the phosphor in the XP-E HEW LED is about three times that of the XP-E LED. Thus, a more efficient LED may be provided, with little or no loss of dCCT.

Figure 8:
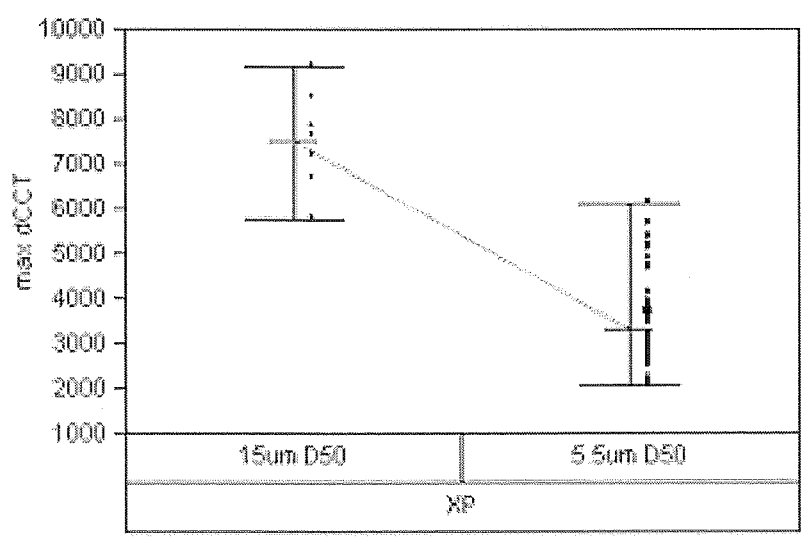
FIG. 8 graphically illustrates maximum variation in change of CCT for various thicknesses of phosphor.

In sharp contrast, FIG. 8 compares 15 μm average particle size phosphor vs. 5.5 μm average particle size phosphor, for the same XP-E LED. As shown in FIG. 8, a very large change maximum dCCT is produced. Again, unexpectedly, comparing FIGS. 7 and 8, the XP-E HEW LED of FIG. 7 allows large particle sizes to be used with a large increase in efficiency, but without the large increase in max dCCT. In contrast, the XP-E LED of FIG. 8 shows a large increase in dCCT when larger phosphors are used.

Figure 9:
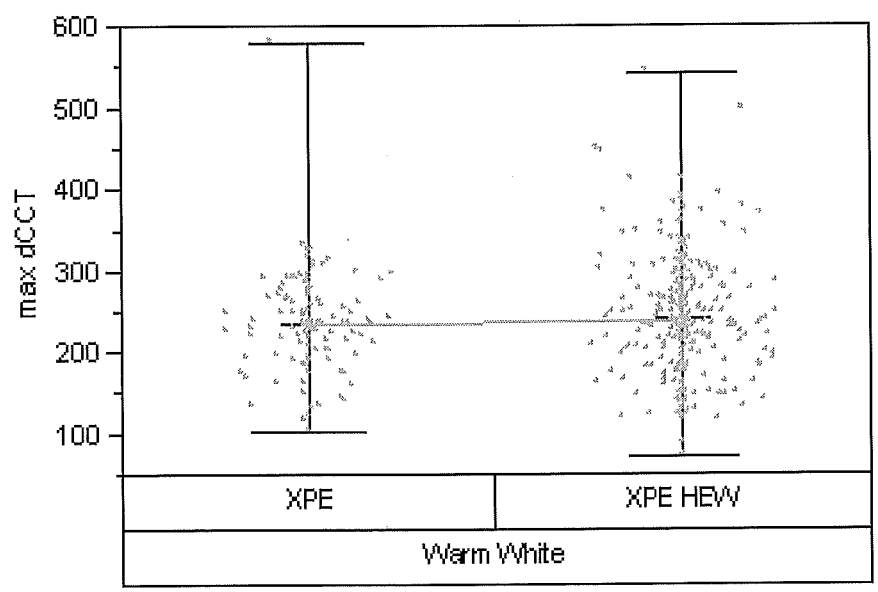
FIG. 9 graphically illustrates a comparison of maximum change in CCT for various warm white LEDs.

FIG. 9 is similar to FIG. 7, but for a warm white XP-E HEW LED. Again, very small difference in max dCCT is produced, even though the XP-E HEW LED uses about three times larger phosphor particles than the XP-E LED.

Accordingly, FIGS. 7-9 illustrate various embodiments wherein for cool white light (a blue LED with yellow phosphor), a light emitting diode is configured to produce a max dCCT of less than or about 3,000 and, in some embodiments, less than or about 2,000. These figures also illustrate other embodiments for warm white light (a blue LED with yellow and red phosphor) wherein the light emitting diode is configured to produce a max dCCT of less than or about 1,000 in some embodiments, less than or about 500 in other embodiments, and less than or about 300 in still other embodiments. For warm white light, the max dCCT may be lower, as compared to cool white light, due to the increased scattering from the thicker films. Neutral white light LEDs may also use red and yellow phosphor, but the films may be thinner than warm light, and the ratios of yellow to red may be higher, so that the max dCCT will also likely be higher compared to the warm white light max dCCT described above.

It will also be understood that max dCCT may be determined by measuring the CCT in one degree increments of theta, which is varied from approximately −90° to +90° from normal, over four phi angles in 45° increments relative to a reference LED position (for example, at 0°, 45°, 90° and 135° from a reference position in the plane of the substrate). Measurements at high theta angles where the light intensity is less than about 10% of the intensity of the normal position are excluded. The average max dCCT is determined by subtracting the min CCT from the max CCT for each scan, with the average max dCCT taken over the four scans.

Figure 11A:
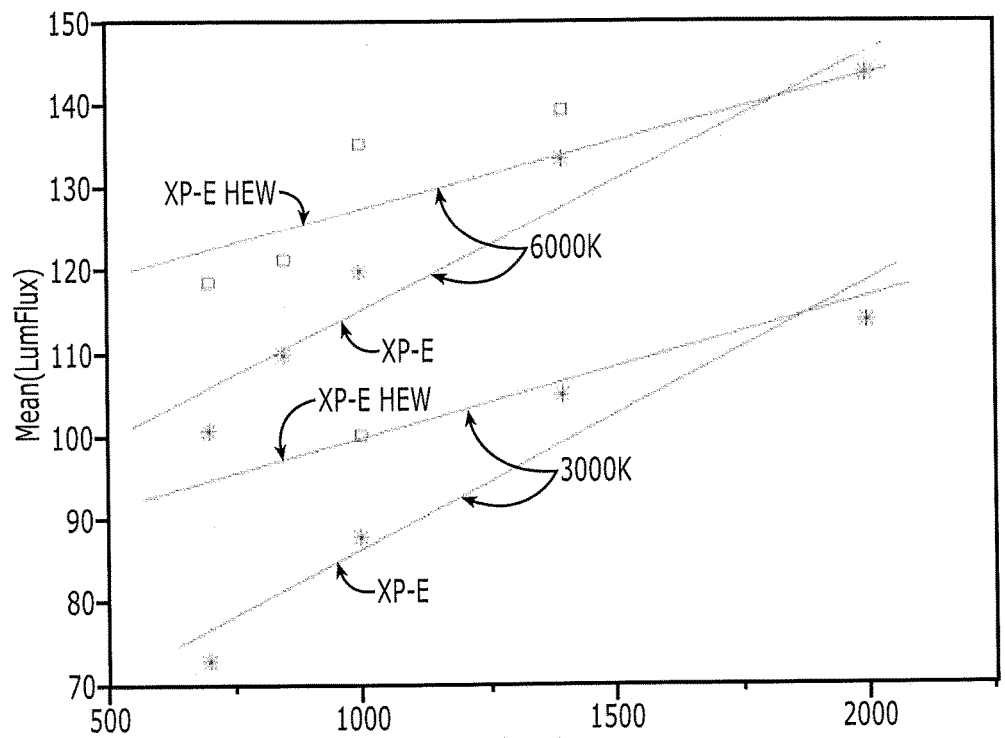
FIG. 11A graphically illustrates a bivariate fit of mean luminous flux as a function of die size of various packaged LEDs according to various embodiments described herein.
Figure 11B:
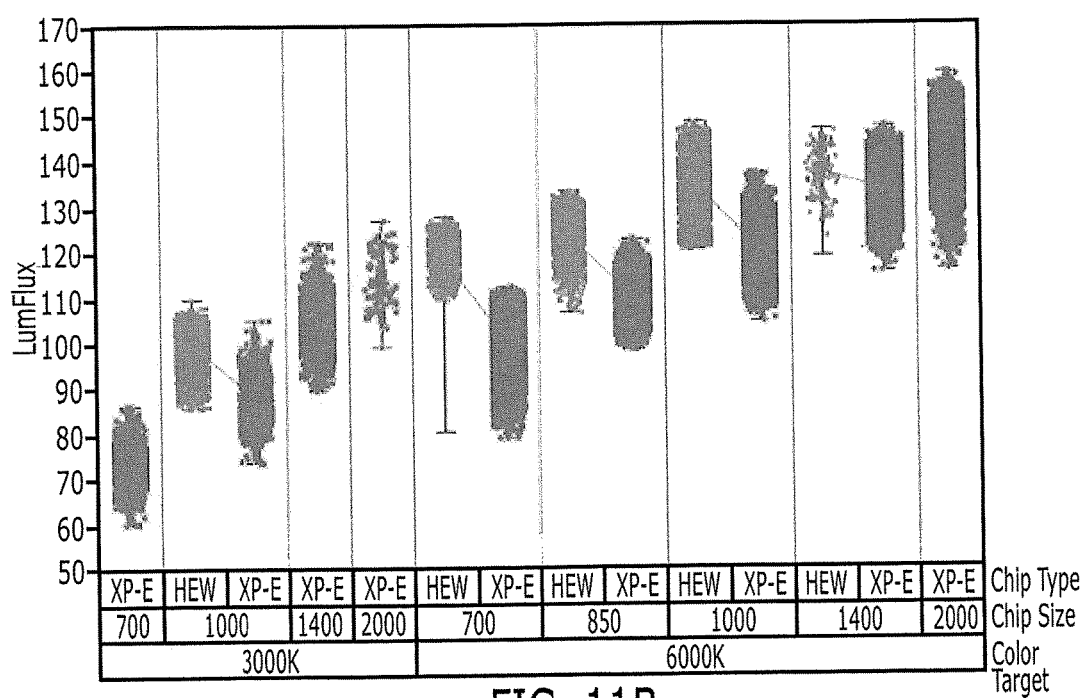
FIG. 11B graphically illustrates variability in luminous flux for samples of packaged LEDs as a function of LED die size according to various embodiments described herein.

Luminous Output:

FIG. 11A graphically illustrates mean luminous flux, in lumens, as a function of size of the LED die, such as the size of the inner face, for XP-E LEDs and XP-E HEW LEDs for warm white light (3,000K) and for cool white light (6,000K) according to various embodiments described herein. FIG. 11B illustrates variability in luminous flux for multiple samples of these LEDs for various die sizes. In both figures, the LED dies are square LED dies having same equivalent phosphor concentration and being mounted on square submounts having sides of about 3.5 mm. The lenses of the XP-E LEDs are about 2.55 mm in diameter, whereas the lenses of the XP-E HEW LEDs are about 3.06 mm in diameter. The submount contact pad configuration may also be modified to provide a submount as illustrated in FIG. 6A compared to submounts of vertical wire bonded XP-E LEDs that include a wire bonded top contact. All data shows total luminous output at a drive current of about 350 mA drive current.

Referring to FIG. 11A, mean flux falls as a function of smaller LED die size for both the XP-E and the XP-E HEW LEDs. However, unexpectedly, for die sizes having sides that are smaller than about 1750 μm, the luminous flux falls much more slowly for the XP-E HEW LEDs compared to the XP-E LEDs. In fact, as die size decreases below sides of about 1,000 μm to about 500 μm, this difference becomes even more apparent.

FIG. 11B illustrates variability in luminous flux for large samples of XP-E HEW LEDs (labeled "HEW" in FIG. 11B) and XP-E LEDs of varying die sizes.

Various embodiments of XP-E HEW LEDs as described herein can provide packaged LEDs that comprise a diode region, an n-type layer, a p-type layer, an anode contact and a cathode contact on the same face, a transparent substrate with oblique sidewalls, a conformal layer that comprises phosphor, a submount and a lens. The XP-E HEW data of FIGS. 11A and 11B illustrate embodiments wherein the inner face is a square inner face having sides of less than or about 1,000 μm long and wherein the packaged light emitting diode emits a luminous flux of at least or about 120 lumens of cool white light or at least about 95 lumens of warm white light, at about 350 mA drive current. As illustrated, other embodiments can provide a luminous flux of at least or about 135 lumens of cool white light or at least or about 100 lumens of warm white light, and still other illustrated embodiments can provide a luminous flux of at least or about 140 lumens of cool white light or at least or about 105 lumens of warm white light, at about 350 mA drive current. These figures also illustrate XP-E HEW LEDs having die sides of less than or about 850 μm that emit a luminous flux of at least or about 125 lumens of cool white light or at least or about 90 lumens of warm white light, at about 350 mA drive current. These figures also illustrate other embodiments that have die sides of less than or about 700 μm and a luminous flux of at least or about 115 lumens of cool white light or at least or about 90 lumens of warm white light, at about 350 mA drive current.

Various embodiments of XP-E HEW LEDs as described herein can also provide packaged LEDs that comprise a light emitting diode die having sides of less than or about 1,000 μm long, and a square submount having sides of less than or about 3.5 mm long. The light emitting diode die is mounted on the submount. A lens extends from the submount to surround the light emitting diode die. The XP-E HEW data of FIGS. 11A and 11B illustrate embodiments wherein the packaged light emitting diode emits at least or about 120 lumens of cool white light or at least or about 95 lumens of warm white light, at about 350 mA drive current. As illustrated, other embodiments can emit at least or about 135 lumens of cool white light or at least or about 100 lumens of warm white light, at about 350 mA drive current. Still other embodiments can emit at least or about 140 lumens of cool white light or at least or about 105 lumens of warm white light, at about 350 mA drive current. Yet other embodiments comprise a light emitting diode die having sides of less than or about 850 µm, wherein the packaged light emitting diode emits at least or about 125 lumens of cool white light or at least or about 90 lumens of warm white light, at about 350 mA drive current. Still other embodiments illustrate sides of less than or about 700 µm, wherein the packaged light emitting diode emits at least or about 115 lumens of cool white light or at least or about 90 lumens of warm white light. These embodiments may also be regarded in terms of submount area, with some embodiments providing a submount area of less than or about 25 mm$^2$, other embodiments providing a submount area of less than or about 12.25 mm$^2$, and still other embodiments providing a submount area of less than or about 10 mm$^2$.

Figure 12:
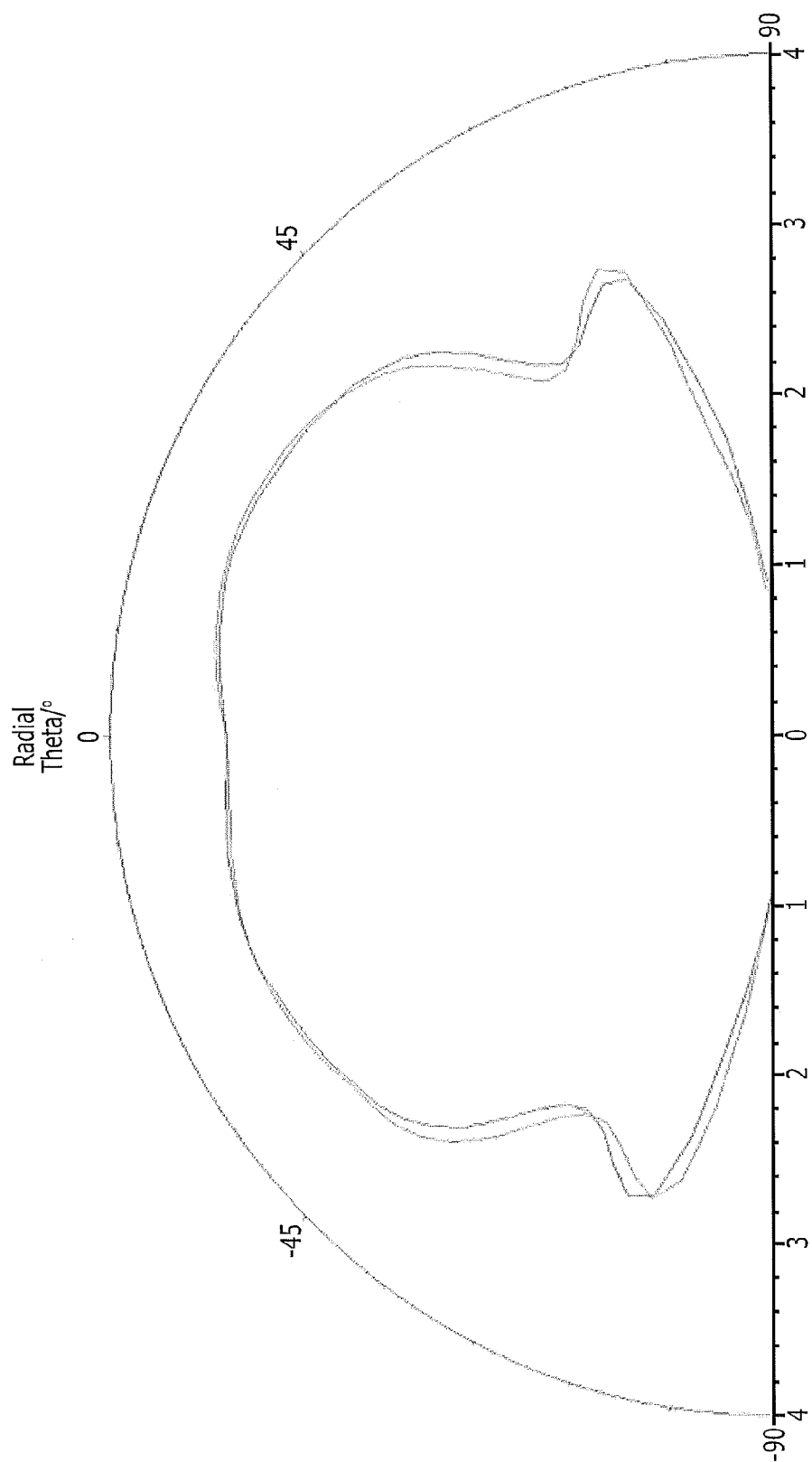
FIG. 12 graphically illustrates far field emission as a function of angle for various LEDs of FIGS. 11A and 11B.
Figure 13:
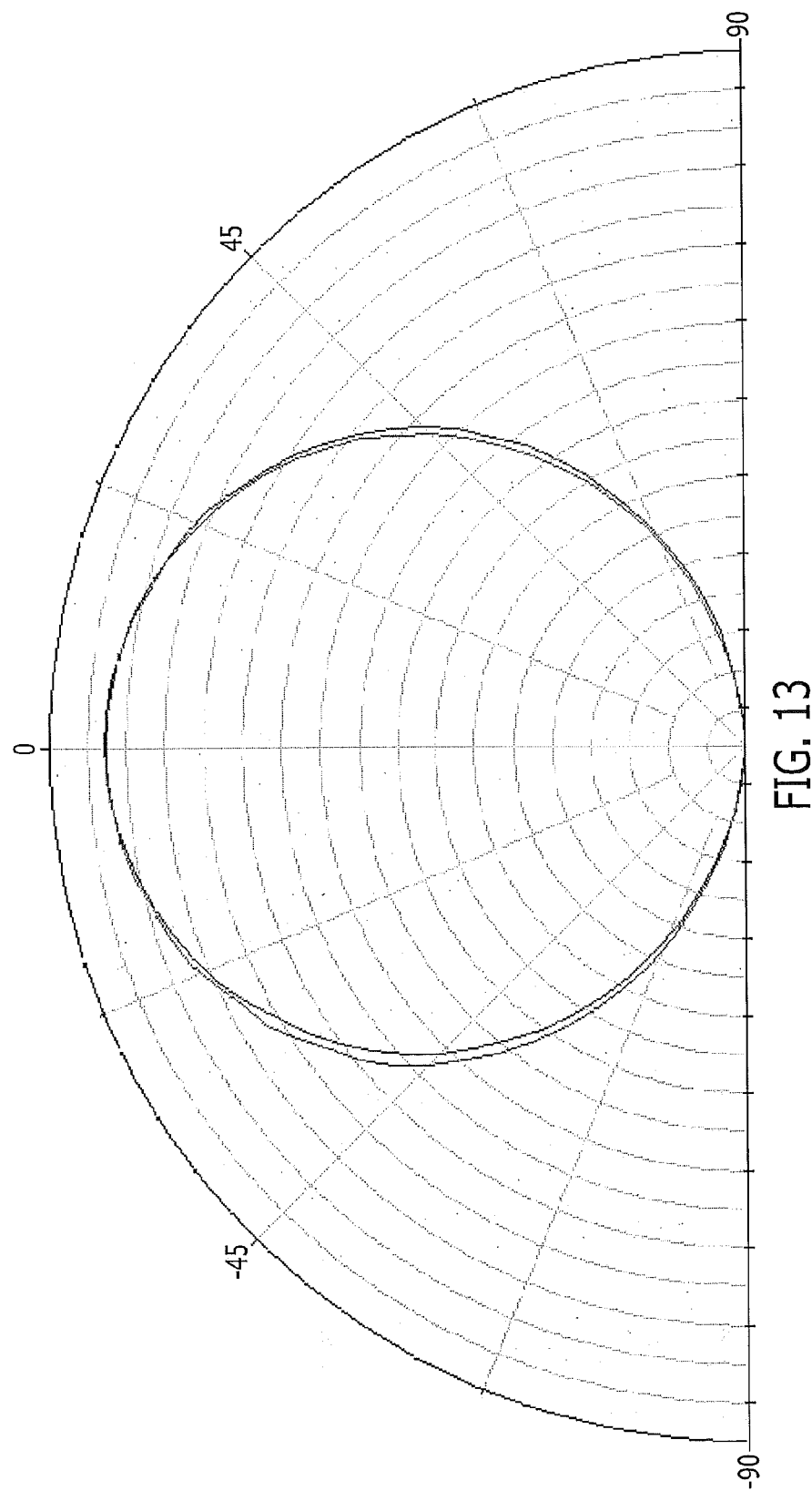
FIG. 13 graphically illustrates far field emission as a function of angle for various other LEDs of FIGS. 11A and 11B.

FIG. 12 graphically illustrates far field emission of XP-E HEW LEDs of FIGS. 11A and 11B having die size 1,000 µm×1,000 µm across two orthogonal axes as a function of angle. FIG. 13 provides similar data for XP-E LEDs of die size 1,000 µm×1,000 µm. In both FIGS. 12 and 13, the illumination is almost identical across the two orthogonal axes, due to the square LED dies and symmetric packages. However, unexpectedly, XP-E HEW LEDs show far more side illumination in FIG. 12 than the XP-E LEDs of FIG. 13, which show a standard Lambertian emission. Accordingly, more side emission is provided by XP-E HEW LEDs of FIG. 12 and more total overall illumination is also provided as was shown in FIGS. 11A and 11B.

Various embodiments described herein can extend the light output and efficacy of LEDs so as to enable fixture designs that can use up to 50% fewer LEDs. XLamp XP-E HEW LEDs according to various embodiments described herein, can deliver up to about 148 lumens of cool white (6,000K) and up to about 114 lumens of warm light (3000K) at about 350 mA drive current. In addition to light output and efficacy improvements, these LEDs can provide a reduced thermal resistance of 6° C./w. Moreover, with larger die attach area and less die underfill, more robust LEDs than conventional flip-chip technologies may be provided.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:
1. A light emitting diode comprising:
a diode region having first and second opposing faces and including therein an n-type layer and a p-type layer;
an anode contact that ohmically contacts the p-type layer and extends on the first face;
a cathode contact that ohmically contacts the n-type layer and that also extends on the first face;
a transparent substrate on the second face, the transparent substrate including an inner face adjacent the second face, an outer face remote from the second face and a sidewall that extends from the outer face to the inner face; and
a conformal layer that comprises phosphor having an average equivalent particle diameter d50 of between about 10 µm and about 20 µm, on the outer face and extending on the sidewall oblique to the inner face.

2. A light emitting diode according to claim 1 wherein the conformal layer that comprises phosphor has an average equivalent particle diameter d50 of about 15 µm.

3. A light emitting diode according to claim 1 wherein the conformal layer that comprises phosphor has an average equivalent particle diameter d50 of between about 15 µm and about 17 µm.

4. A light emitting diode according to claim 1 wherein the conformal layer that comprises phosphor having an average equivalent particle diameter d50 of between about 10 µm and about 20 µm is of uniform thickness on the outer face and on the sidewall.

5. A light emitting diode according to claim 1 wherein the diode region is configured to emit blue light upon energization thereof and wherein the conformal layer comprises yellow phosphor having an average equivalent particle diameter d50 of between about 10 µm and about 20 µm.

6. A light emitting diode according to claim 1 wherein the diode region is configured to emit blue light upon energization thereof and wherein the conformal layer comprises a mixture of yellow phosphor having an average equivalent particle diameter d50 of between about 10 µm and about 20 µm and red phosphor.

7. A light emitting diode according to claim 1 wherein the conformal layer comprises a mixture of yellow phosphor having an average equivalent particle diameter d50 of between about 10 µm and about 20 µm and red phosphor, in a phosphor weight ratio of the yellow phosphor to the red phosphor of at least about 5:1.

8. A light emitting diode according to claim 1 wherein the conformal layer comprises a mixture of yellow phosphor having an average equivalent particle diameter d50 of between about 10 µm and about 20 µm and red phosphor in a phosphor weight ratio of the yellow phosphor to the red phosphor of at least about 9:1.

9. A light emitting diode according to claim 1 wherein the anode and cathode contacts that both extend on the first face are coplanar.

10. A light emitting diode according to claim 1 in combination with a submount having a submount face and an anode pad and a cathode pad thereon, the light emitting diode being mounted on the submount such that the first face is adjacent the submount face, the outer face is remote from the submount, the anode contact is adjacent the anode pad and the cathode contact is adjacent the cathode pad.

11. A light emitting diode according to claim 10 wherein the anode contact is mounted directly on the anode pad and the cathode contact is mounted directly on the cathode pad.

12. A light emitting diode according to claim 10 in further combination with a lens that extends from the submount face to surround the light emitting diode.

13. A light emitting diode according to claim 10 wherein the conformal layer that comprises phosphor having an average equivalent particle diameter d50 of between about 10 µm and about 20 µm also extends onto the submount face.

14. A light emitting diode according to claim 13 wherein the submount includes a reflective layer thereon that extends between the submount face and the conformal layer that comprises phosphor that extends on the submount face.

15. A light emitting diode according to claim 1 wherein the cathode contact and the anode contact collectively occupy at least about 90% of an active area of the diode region.

16. A light emitting diode according to claim 1 wherein the inner and outer faces define a height therebetween and wherein a ratio of the height to a side of the inner face is at least about 0.3.

17. A light emitting diode according to claim 1 wherein an area ratio of the outer face to the inner face is less than or about 0.33.

18. A light emitting diode according to claim 17 wherein the inner and outer faces define a height therebetween and wherein a ratio of the height to a side of the inner face is at least about 0.4.

19. A light emitting diode according to claim 1 wherein an area ratio of the outer face to the inner face is less than or about 0.04.

20. A light emitting diode according to claim 19 wherein the inner and outer faces define a height therebetween and wherein a ratio of the height to a side of the inner face is at least about 0.8.

21. A light emitting diode according to claim 1 wherein the substrate includes a groove therein at the outer face.

22. A light emitting diode according to claim 5 wherein the light emitting diode is configured to produce a maximum variation of Correlated Color Temperature of less than or about 3,000.

23. A light emitting diode according to claim 5 wherein the light emitting diode is configured to produce a maximum variation of Correlated Color Temperature of less than or about 2,000.

24. A light emitting diode according to claim 6 wherein the light emitting diode is configured to produce a maximum variation of Correlated Color Temperature of less than or about 1,000.

25. A light emitting diode according to claim 6 wherein the light emitting diode is configured to produce a maximum variation of Correlated Color Temperature of less than or about 500.

26. A light emitting diode according to claim 6 wherein the light emitting diode is configured to produce a maximum variation of Correlated Color Temperature of less than or about 300.

27. A light emitting diode according to claim 1 wherein an area ratio of the outer face to the inner face is less than or about 0.4.

28. A light emitting diode according to claim 1 wherein the outer face is of smaller area than the inner face and wherein the sidewall is an oblique sidewall that extends at an oblique angle from the outer face towards the inner face.

* * * * *